United States Patent
Clarke

(10) Patent No.: US 11,392,848 B2
(45) Date of Patent: Jul. 19, 2022

(54) QUBIT ASSEMBLY HAVING ADJUSTABLE CURRENT OPERATORS

(71) Applicant: David James Clarke, Silver Spring, MD (US)

(72) Inventor: David James Clarke, Silver Spring, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 497 days.

(21) Appl. No.: 16/445,889

(22) Filed: Jun. 19, 2019

(65) Prior Publication Data

US 2020/0401922 A1   Dec. 24, 2020

(51) Int. Cl.
*H01L 39/22* (2006.01)
*G06N 10/00* (2022.01)

(52) U.S. Cl.
CPC ........... *G06N 10/00* (2019.01); *H01L 39/223* (2013.01)

(58) Field of Classification Search
CPC .............................. G06N 10/00; H01L 39/223
See application file for complete search history.

(56) References Cited

U.S. PATENT DOCUMENTS

| | | |
|---|---|---|
| 3,758,795 A | 9/1973 | Anacker et al. |
| 10,255,557 B2 | 4/2019 | Epstein et al. |
| 2002/0188578 A1 | 12/2002 | Amin et al. |
| 2003/0207766 A1 | 11/2003 | Esteve et al. |
| 2004/0173793 A1 | 9/2004 | Blais et al. |
| 2006/0147154 A1 | 7/2006 | Thom et al. |
| 2009/0289638 A1 | 11/2009 | Farinelli et al. |
| 2017/0286859 A1 | 10/2017 | Harris et al. |
| 2020/0279186 A1* | 9/2020 | Ferguson ............... G06N 10/00 |

OTHER PUBLICATIONS

Extended Search Report for corresponding EP 11 76 6454 dated Mar. 29, 2017.
International Search Report for corresponding PCT/US11/30304 dated May 18, 2011.

(Continued)

*Primary Examiner* — Matthew L Reames
(74) *Attorney, Agent, or Firm* — Tarolli, Sundheim, Covell & Tummino LLP

(57) ABSTRACT

A qubit assembly includes a first superconducting loop comprising a first Josephson junction and a second Josephson junction, a second superconducting loop comprising the second Josephson junction and a third Josephson junction, and a third superconducting loop comprising the third Josephson junction and a fourth Josephson junction. A flux source is configured to provide a control flux to the second superconducting loop, such that the effective commutation relations between a first quantum operator corresponding to current in the first superconducting loop and a second quantum operator corresponding to current in the third superconducting loop can be changed by changing a magnitude of the control flux provided to the second superconducting loop by the flux source.

18 Claims, 3 Drawing Sheets

(56) References Cited

OTHER PUBLICATIONS

Sillanpaa, et al, "Coherent Quantum State Storage and Transfer Between Two Phase Qubits Via a Resonant Cavity"; Nature 449. Dec. 27, 2007, p. 438-442, retrieved on May 18, 2011, Retrieved from URL: arxiv.org/PS_cache/arxif/pdf/0709/0709.2341v1.pdf: p. 2, paragraph 2; p. 3, paragraph 2 and 3; p. 14, paragraph 1.

Anonymous: 11 Kitaev is scheme for a protected qubit in a circuit 11, 2' 008, XP055696835, Retrieved from the Internet: URL:http://theory.caltech.edu/-reskill/papers/Kitaev-superconducting-qubit.pdf [retrieved on May 19, 2020] p. 1-p. 13.

Alexei Kitaev: 11 Protected qubit based on a superconducting current mirror 11, arxiv .org, Cornell University Li Bra Ry, 201 Olin Library Cornell University Ithaca, NY 14853, Sep. 19, 2006 (Sep. 19, 2006), XP080251290, p. 1-p. 6.

Doua Otb et al: "Key Issues Reviews;Physical implementation of protected Qubits;Physical implementation of protected qubits", Reports on Progress in Physics, Institute of Physics Publishing, Bristol, GB, vol. 75, No. 7, Jun. 28, 2012 (Jun. 28, 2012), p. 72001, XP020225209, ISSN: 0034-4885, DOI: 10.1088/0034-4885/75/7/072001 abstract; Sections 1, 4, 5, and 6; figure 8.

Sergey Gladchenko et al: "Superconducting nanocircuits for topologically protected qubits", Nature Physics, vol. 5, No. 1, 2009, pp. 48-53, XP055697467, GB ISSN: 1745-2473, DOI: 10.1038/nphysl151 abstract; p. 48-p. 52; figures 1, 2.

International Search Report for International Application No. PCT/US2020/016620 dated Jun. 9, 2020.

Wallquist, et al: "Superconducting Qubit Network with Controllable Nearest-Neighbour Coupling; Superconducting Qubit Network with Controllable Nearest-Neighbour Coupling"; New Journal of Physics, Institute of Physics Publishing, Bristol, GB; vol. 7, No. 1, Aug. 26, 2005, p. 178, XP020092901,ISSN: 1367-2630, DOI: 10.1088/1367-2630/7/1/178; entire document.

Harris, et al.: "Experimental Demonstration of a Robust and Scalable Flux Qubit"; arxiv.org, Cornell University Library, 201 Olin Library Cornell University Ithaca, NY 14853, Sep. 24, 2009, XP0808368157, DOI: 10.1103/PHYSREVB.81.134510; entire document.

Krantz, et al.: "A Quantum Engineer's Guide to Superconducting Qubits"; arxiv.org, Cornell University Library, 201 Olin Library Cornell University Ithaca, NY 14853; Apr. 13, 2019, CP081458630, DOI:10.1063/1.5089550; entire document.

International Search Report from corresponding PCT/US2020/032909, dated Aug. 28, 2020.

International Preliminary Report on Patentability for corresponding PCT/US2020/032909; dated Dec. 21, 2021.

\* cited by examiner

QUBIT ASSEMBLY HAVING ADJUSTABLE CURRENT OPERATORS

TECHNICAL FIELD

This invention relates to quantum computing, and more particularly, to a qubit assembly having adjustable current operators.

BACKGROUND

Classical bits of information can exist in one of two states, referred to as 0 or 1. Qubits also have two states |0> and |1> but can exist in 'superpositions' where the qubit has complex probability amplitudes for being in each state at any given time. The probability amplitude of being in the state |0> may be represented as $\cos(\theta/2)$, while the probability amplitude of being in the state |1> may be represented as $\sin(\theta/2)\exp(i\phi)$. These angles can be visualized as representing the points on a "Bloch sphere" of unit radius, and the state of a qubit can characterized by a "qubit polarization vector" that extends from the center of the sphere to this point. When a state of a qubit is read out, that is, transferred to a classical bit, it is typically read out along the Z axis. Such a readout returns the classical bit value 0 with a probability $(1+\cos(\theta))/2$ that is related to the projection $\cos(\theta)$ of the polarization vector along the vertical "z-axis". Similarly, the readout returns 1 with probability $(1-\cos(\theta))/2$. The value $\cos(\theta)$ is the expectation value of the Pauli-Z operator, and this type of readout is termed readout along the "Pauli-Z" direction. Most superconducting qubits can only be read out along a single axis, which is then typically referred to as the "Pauli-Z" direction.

SUMMARY OF THE INVENTION

In accordance with an aspect of the present invention, a qubit assembly includes a first superconducting loop comprising a first Josephson junction and a second Josephson junction, a second superconducting loop comprising the second Josephson junction and a third Josephson junction, and a third superconducting loop comprising the third Josephson junction and a fourth Josephson junction. A flux source is configured to provide a control flux to the second superconducting loop, such that the effective commutation relations between a first quantum operator corresponding to current in the first superconducting loop and a second quantum operator corresponding to current in the third superconducting loop can be changed by changing a magnitude of the control flux provided to the second superconducting loop by the flux source.

In accordance with another aspect of the present invention, a method includes coupling a first superconducting loop, associated with a first qubit and having an associated first quantum operator, to a second superconducting loop, associated with a second qubit and having an associated second quantum operator. A first control flux is provided to the first qubit to tune the first quantum operator to represent an axis of the Bloch sphere. A second control flux is provided to the second qubit to tune the second quantum operator to represent the axis of the Bloch sphere.

In accordance with yet another aspect of the present invention, a first value for a control flux is provided to a first superconducting loop of a qubit to provide a quantum operator corresponding to current in a second superconducting loop having a set of basis states. A second value for the control flux is provided to the first superconducting loop of a qubit to alter the set of basis states associated with the quantum operator.

DETAILED DESCRIPTION

Figure 1:
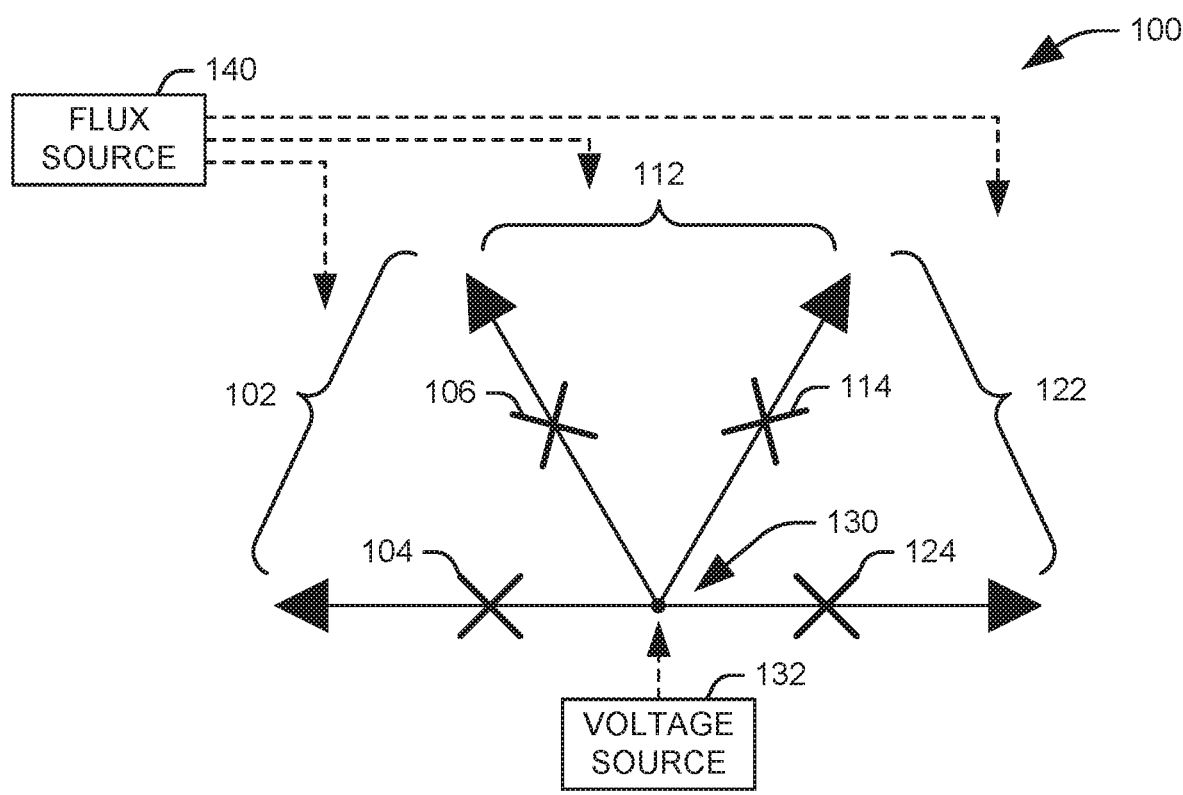
FIG. 1 illustrates a qubit assembly having adjustable current operators.

While some quantum platforms allow passive rotations of the measurement apparatus relatively easily, many others, including in particular prior forms of superconducting qubits, generally allow for readout only along one effective spin axis at a time. This readout axis most often takes one of three forms: a voltage readout, a persistent current readout, or readout along an axis aligned with the system Hamiltonian, referred to as dispersive readout. In many systems, these readout methods will either measure the same effective spin axis as one another or provide no information at various points in configuration space. For instance, a tunable flux qubit consisting of an inductor shunted by a compound Josephson junction may be read out by the persistent current through the inductor when the qubit is in its double-well regime. The current circulating in the compound Josephson junction is another possible readout channel, which in principle might be orthogonal to the inductor persistent current as the compound Josephson junction flux governs the hopping of flux vortices in and out of the main loop. Unfortunately, the magnitude of the circulating compound Josephson junction current drops precipitously in the double-well regime, which precludes measurements of the orthogonal axis in the best regime for the persistent current through the inductor.

The qubit assemblies described herein utilize tunable superconducting loops to represent current operators along multiple possible directions, including arbitrary axes within a plane perpendicular to a primary readout axis. For example, two current operators can be tuned to be orthogonal to each other as well as a primary operator of the qubit, such that the qubit can be readout along three independent and orthogonal axes: the "Pauli-X" direction, the "Pauli-Y" direction and the "Pauli-Z" direction. The current operators can be selected to allow for the coupling of qubits along varying axes, which can facilitate the construction of designer phases of matter.

One implementation of the qubit assembly provides a set of effective spin axes for a superconducting qubit from several current operators and one voltage operator. In a general sense, this qubit design concept adds passive transformations of the local qubit measurement axis to the toolbox available to superconducting qubits for quantum operations that can be conducted and concatenated by a classical coprocessor. While the current and voltage operators are always orthogonal and non-commuting in the low energy subspace, the various current operator commutation relations can be tuned via the application of external magnetic flux. Since this external flux is set classically, passive rotations of the qubit may be performed by choosing a measurement operator and/or setting the flux. Accordingly, fidelity for a series of rotations is limited by the readout for the single measurement at the end of the series rather than by coherence times for the intermediate rotations.

FIG. 1 illustrates a qubit assembly 100 having adjustable current operators. A first superconducting loop 102 includes a first Josephson junction 104 and a second Josephson junction 106. A second superconducting loop 112 includes the second Josephson junction 106 and a third Josephson junction 114. A third superconducting loop 122 includes the third Josephson junction 114 and a fourth Josephson junction 124. It will be appreciated that, in one implementation, each loop 102, 112, and 122 can be formed as two connections to a superconducting ground. In one implementation, each of the first, second, third, and fourth Josephson junction 104, 106, 112, and 114 have a same critical current. It will further be appreciated that each loop can comprise multiple Josephson junctions, arranged either in series or in parallel.

The Josephson junctions 104, 106, 114, and 124 isolate a portion of the qubit assembly 100, referred to herein as a superconducting island 130. A voltage source 132 is configured to apply an offset voltage to the superconducting island 130. In one implementation, a capacitor (not shown) can be coupled to the superconducting island 130 to provide the offset voltage. A flux source 140 is configured to provide flux selectively to each of the superconducting loops 102, 112, and 122. Specifically, the control flux provided to the second superconducting loop can be selected to adjust a commutation relationship between respective current operators represented by each of the first superconducting loop 102 and the third superconducting loop 122. The flux sources 140 can be implemented as any of a variety of circuit devices and elements that can provide magnetic flux, such as current-carrying inductors. It will be appreciated that the flux source 140 can include multiple discrete components for providing flux to the various superconducting loops 102, 112, and 122.

When a flux of one half of a flux quantum is threaded through one of the loops 102, 112, and 122, the loop allows no current to pass from the main node to ground, effectively acting as a capacitor with capacitance equal to the combined capacitance of the Josephson junctions. The flux tuning necessary to stop the flow of current from the main node to ground is referred to as the "cancellation point" for that set of elements. Similarly, the voltage provided by the voltage source 132 can be tuned to shift a charging energy of the superconducting island to a degeneracy point.

When the flux through each of the loops is at the cancellation point, and the voltage from the voltage source 130 is tuned to the degeneracy point, the Hamiltonian in the computational subspace, including states |n> and |n+1>, is precisely zero. When tuned in this manner, the qubit 100 retains non-zero current and voltage dipoles, allowing the qubit's energy to be tuned by external voltages or flux or allowing coupling between multiple qubits. Several operators can be defined according to their effects on the qubit state, including two current dipole operators, $J_x$ and $J_y$, and a voltage dipole operator, $V_z$. The first current dipole operator, $J_x$, has two eigenstates, representing respective directions of current in the first superconducting loop 102. Similarly, the second current dipole operator, $J_y$, has two eignstates, representing respective directions of currents in the third superconducting loop 122. The voltage dipole operator has two eigenstates, each representing a measured voltage between the superconducting island 130 and ground.

The current dipole operators do not commute with the voltage dipole operator, and depending on a control flux applied to the second superconducting loop 112, may not commute with each other. When the control flux applied to the second superconducting loop 112 has a magnitude equal to one-quarter of a flux quantum, the two current dipole operators and the voltage dipole operator form an orthogonal triad of basis vectors for the qubit assembly 100, which can be normalized as $J_X=|J_x|\sigma_x$, $J_Y=\pm|J_y|\sigma_y$, and $V_Z=|V_z|\sigma_z$, where $\sigma_x$, $\sigma_y$, and $\sigma_z$ are the Pauli matrices, $|J_x|$ is the persistent current when the qubit is polarized in the +1 eigenstate of the Pauli X operator, $|J_y|$ is the persistent current when the qubit is polarized in the +1 eigenstate of the Pauli Y operator, and $|V_z|$ is a voltage that can be measured between the superconducting island 130 and ground when the qubit is in the +1 eigenstate of the Pauli Z operator. In this instance, the current operators will not commute, as they are orthogonal. For other values of the control flux applied to the second superconducting loop 112, the current operators can be parallel, and thus commuting.

In this qubit design, the identity operator does not appear in the projection of the current or voltage operators into the computational subspace. This is an advantageous feature for coupling qubits together without creating spurious single-qubit Hamiltonian terms. Additionally, when the qubit is in the is in the +1 eigenstate of the Pauli Z operator, the expectation value of the current in the first and third superconducting loops 102 and 122 is zero. However, when one of those loops, for example, the first superconducting loop 102, is measured, a persistent current will appear as the qubit is projected into one of the eigenstates of the Pauli X operator. In this sense, current and voltage measurements are quantum nondemolition probes of the qubit state.

The effective commutation relations between the current operators in the first superconducting loop 102 and the third superconducting loop 122 can be changed by changing a magnitude of the flux provided to the second superconducting loop 112 by the flux source. Specifically, when a control flux, $\phi$, provided to the second superconducting loop 112 is set to a given value, the current in the third superconducting loop 122 acts in the ground space as an operator proportional to $$\cos\left(\frac{2\pi\phi}{\phi_0}\right)\sigma_x + \sin\left(\frac{2\pi\phi}{\phi_0}\right)\sigma_y.$$

Accordingly, the control flux can be tuned to allow the qubit to be measured or coupled along an arbitrary axis of the Bloch sphere in the plane perpendicular to the axis defined by the voltage operator.

Figure 2:
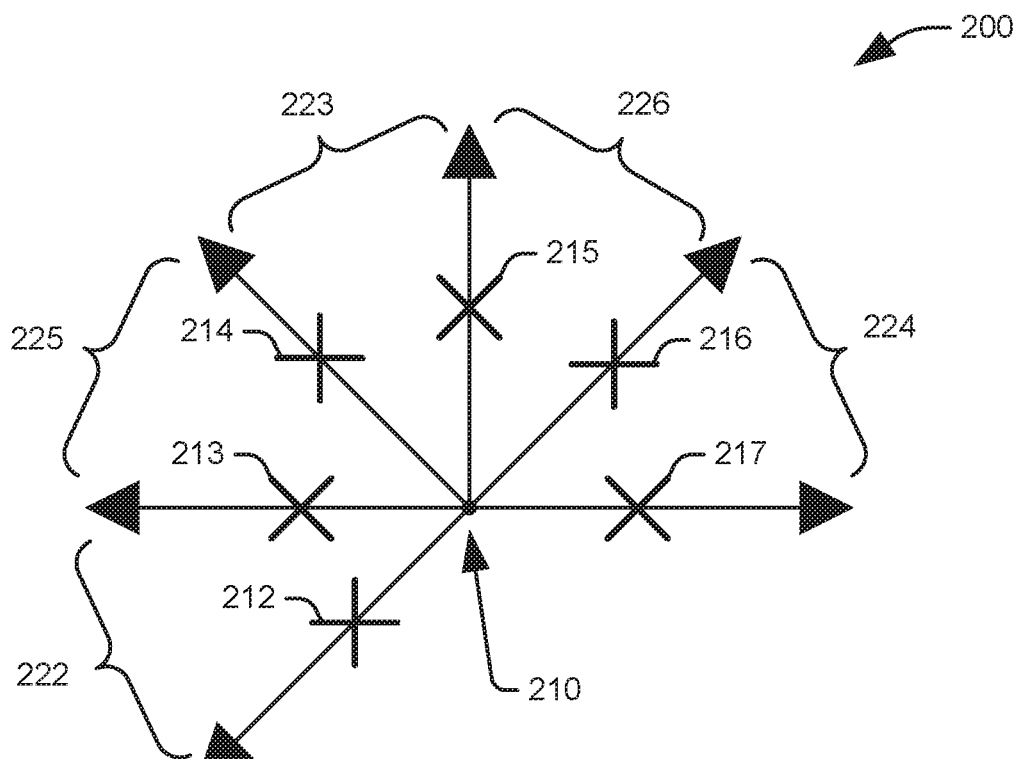
FIG. 2 illustrates an example of a qubit assembly having tunable current operators.

FIG. 2 illustrates an example of a qubit assembly 200 having tunable current operators. The qubit assembly comprises a plurality of connections to ground from a superconducting island 210, with each connection interrupted by an associated Josephson junction 212-217. It will be appreciated that a given connection to ground can include multiple Josephson junctions, arranged either in series or in parallel. For example, each connection to ground can be interrupted by a compound Josephson junction. It will be appreciated that, in a manner similar to the qubit assembly 100 of FIG. 1, the qubit assembly 200 would utilize a voltage source (not shown) to provide an offset voltage to the superconducting island 210 as well as a flux source (not shown) to selectively provide a flux to superconducting loops (e.g., 222-226) formed by the connections to ground.

The Hamiltonian for a qubit assembly having an arbitrary number of tunable current operators, as described herein, can be expressed as:

$$H = E_C(n-n_g)^2 - \Sigma_{i=1}^{M}[E_{J_i}\cos(\theta-\varphi_i)] \qquad \text{Eq. 1}$$

where $E_C$ is the total charging energy of the superconducting island, including all contributions from the Josephson junction capacitances, $E_{J_i}$ is the Josephson energy of the $i^{th}$ Josephson junction, n and $\theta$ are the charge and phase operators on the main node, M is a number of Josephson junctions, $n_g$ is the offset change of the main island, for example, as set by a gate voltage, and $\varphi_i$ is the normalized branch flux for the $i^{th}$ Josephson junction.

More generally, the Josephson junctions can be grouped into N legs, each comprising a set of at least two Josephson junctions. For such a system, the Hamiltonian can be written as:

$$H = E_C(n-n_g)^2 - \Sigma_{k=1}^{N}[E_J^{(k)}(\{\varphi\}_k)\cos(\theta-\vartheta(\{\varphi\}_k))] \qquad \text{Eq. 2}$$

where $\{\varphi\}_k$ represents the set of normalized branch fluxes, $\varphi_i$, for the Josephson junctions that are part of the $k^{th}$ leg, the function represents $E_J^{(k)}(\{\varphi\}_k)$ is the aggregate Josephson energy across all Josephson junctions in the $k^{th}$ leg, and the functions $E_J^{(k)}(\{\varphi\}_k)$ and $\vartheta(\{\varphi\}_k)$ are defined by the standard rules for the sum of cosine terms with the same frequency and the Josephson junctions that are part of the $k^{th}$ leg.

It will be noted from the above that $E_J^{(k)}(\{\varphi\}_k)$ can depend only on the differences between the normalized branch fluxes, and the qubit assembly 200 is designed such that there exists a consistent assignment of magnetic fluxes to the superconducting loops for which $E_J^{(k)}(\{\varphi\}_k)=0$ for all legs. This assignment is assumed to be maximal in the sense that, for each leg, k, there are no sublegs, k', that can be formed from the set of Josephson junctions in leg k for which a similar assignment is available (i.e., there is no k', such that $E_J^{(k')}(\{\varphi\}_{k'})=0$). Since this aggregate Josephson junction depends only on differences between the branch fluxes within a given leg, there are N−1 independent physical magnetic fluxes that can be varied while leaving the Hamiltonian invariant. In one example, these fluxes can be chosen as the differences in the average values, $\overline{\varphi_k}$ of the branch fluxes on the junctions in each leg, allowing for $\vartheta(\{\varphi\}_k)$ to be represented as $\overline{\varphi_k}+\tilde{\vartheta}(\{\varphi\}_k)$, where $\tilde{\vartheta}(\{\varphi\}_k)$ depends only on differences between branch fluxes on junctions within leg k.

At the point for which $E_J^{(k)}(\{\varphi\}_k)=0$ for all legs, the Hamiltonian is simply $H=E_C(n-n_g)^2$. If the gate charge is adjusted to a half-integer value, a degenerate low energy subspace is provided that is separated from the higher energy subspaces by twice the total charging energy of the superconducting island. Within the low energy subspace, operators $n-n_g \sim \frac{1}{2}\sigma_z$, $\cos\theta \sim \frac{1}{2}\sigma_x$, and $\sin\theta \sim \frac{1}{2}\sigma_y$ can be identified, with the latter two following from the commutation relations for phase and charge degrees of freedom. Further, the physical current operator conjugate to some physical magnetic flux, f, within leg k, is given, when $E_J^{(k)}(\{\varphi\}_k)=0$, as $$\frac{dH}{df} = \frac{d}{df}\left[E_J^{(k)}(\{\varphi\}_k)\cos(\theta - \overline{\varphi}_k - \tilde{\vartheta}(\{\varphi\}_k))\right].$$

One of the legs, $k_x$, can be defined as the x-axis by setting the average value for the branch fluxes on that leg to $-\vartheta(\{\varphi\}_{k_x})$, such that the currents in the leg are proportional to $\cos(\theta)$. For the other legs, the direction of the current operators in the computational subspace can be adjusted by varying the physical magnetic flux, $\overline{\varphi}_k-\overline{\varphi}_{k_x}$ for that leg. For example, if average value for the branch flux for a leg, $k_y$, is set to $$-\vartheta(\{\varphi\}_{k_x}) + \frac{\pi}{2},$$

the circulating currents in leg $k_y$ will be proportional to $\sin(\theta)$, and thus provide a current operator aligned along the y-axis.

In the illustrated example, a first current operator is defined in a first leg, corresponding to a first superconducting loop 222, that includes Josephson junctions, 212 and 213, a second current operator is defined in a second leg, corresponding to a second superconducting loop 223, that includes Josephson junctions, 214 and 215, and a third current operator is defined in a third leg, corresponding to a third superconducting loop 224, that includes Josephson junctions, 216 and 217. The difference in the physical magnetic flux for each leg can be controlled by providing control fluxes to the fourth and fifth superconducting loops 225 and 226, allowing for each of the second and third current operators to be tuned relative to the first current operator.

In the illustrated example, an average value for the branch flux in the second superconducting loop 223 can be set as described above such that the second current operator represents an x-axis of the Bloch sphere. A first control flux can be applied to the fourth superconducting loop 225 at a selected magnitude to adjust the direction of the first current operator to a desired direction in the Bloch sphere. In practice, a control flux of magnitude $\phi$, provided to the fourth superconducting loop 225 aligns the operator in a direction proportional to COS $$\left(\frac{2\pi\phi}{\phi_0}\right)\sigma_x + \sin\left(\frac{2\pi\phi}{\phi_0}\right)\sigma_y.$$

In a similar manner, a second control flux can be applied to the fifth superconducting loop 226 at a selected magnitude to adjust the direction of the third current operator to a desired direction in the Bloch sphere. As a result, the qubit assembly 200 will include a voltage operator, corresponding to a Pauli-Z axis, a first current operator, corresponding to a Pauli-X axis, and two additional current operators corresponding to arbitrarily selected axes within a plane perpendicular to the Pauli-Z axis. It will be appreciated that the qubit assembly 200 can be extended, using the principles described above, with additional connections to ground interrupted by Josephson junctions, to include additional current operators beyond the three described.

Figure 3:
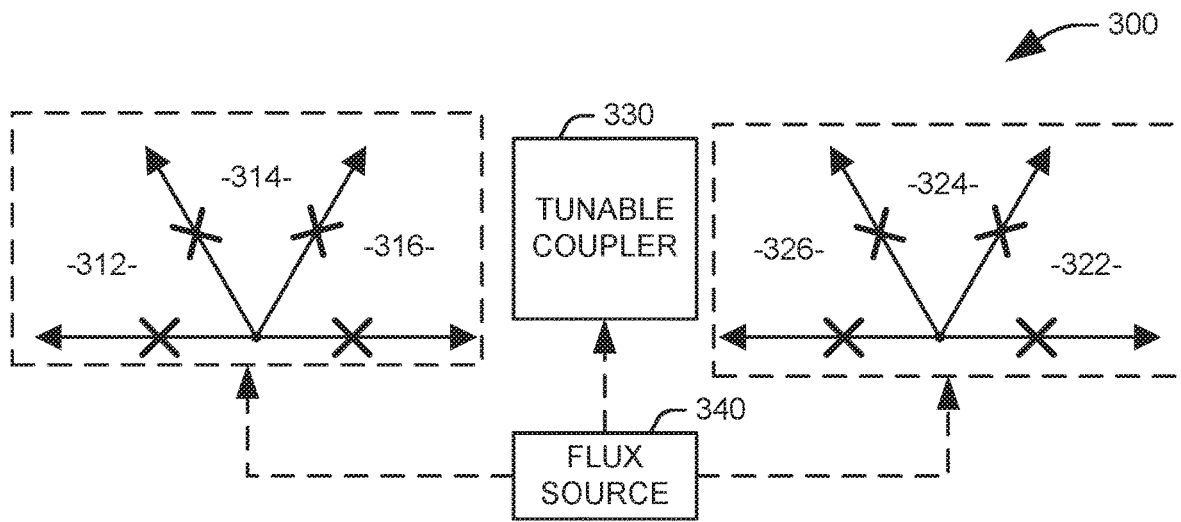
FIG. 3 illustrates one example of a system in which two qubit assemblies are coupled via a tunable coupler to provide a selectable coupling between the two qubit assemblies.

FIG. 3 illustrates a system 300 in which two qubit assemblies 310 and 320 are coupled via a tunable coupler 330 to provide a selectable coupling between the two qubit assemblies. Each qubit assembly 310 and 320 is similar to that described in FIG. 1, with respective first superconducting loops 312 and 322 that represent a first current operator of the qubit associated with the Pauli-X axis, and second superconducting loops 314 and 324 that are receptive to a flux from an associated flux source 340 to tune the direction of a second current operator represented by respective third superconducting loops 316 and 326.

In the illustrated implementation, the tunable coupler 330 is positioned as to couple the third superconducting loops 316 and 326 of the two qubit assemblies 310 and 320. In the illustrated implementation, the tunable coupler 330 is responsive to flux from the flux source to allow for selective coupling of the two qubit assemblies, although it will be appreciated that, in some implementations, a fixed, non-tunable coupling could be used. It will be appreciated that the direction of the second current operator for each of the two qubit assemblies 310 and 320 is selectable, at least within a defined plane of the Bloch sphere, by application of flux to the second superconducting loops 314 and 324. Accordingly, by selecting a same direction for these current operators, the direction of the coupling between the two qubits 310 and 320 can be dynamically selected.

This selectable coupling can be used to create unique lattices of qubits for quantum spin systems, and qubits can be coupled along the Z-axis, such that an alignment of respective voltage operators associated with qubits is energetically favorable, as well as via the loops representing the two current operators. In one example, a set of qubits can be arranged in a Kitaev Honeycomb lattice, such that each qubit is coupled to a set of three neighboring qubits. In this example, the qubit is coupled to a first neighboring qubit along the Z-axis via a coupling between the superconducting islands of the qubits, coupled to a second neighboring qubit along the X-axis via a coupling between the superconducting loops containing the first current operators of the qubits, and coupled to a third neighboring qubit along the Y-axis via a coupling between the superconducting loops containing the second current operators of the qubits. It will be appreciated, however, that the qubit assemblies disclosed herein can have more than two current operators when more than three superconducting loops are used, and that the orientation of the second and subsequent current operators for each qubit are dynamically tunable. Accordingly, lattices of qubits with more than three couplings or with couplings along directions other than axial directions are envisioned.

Figure 5:
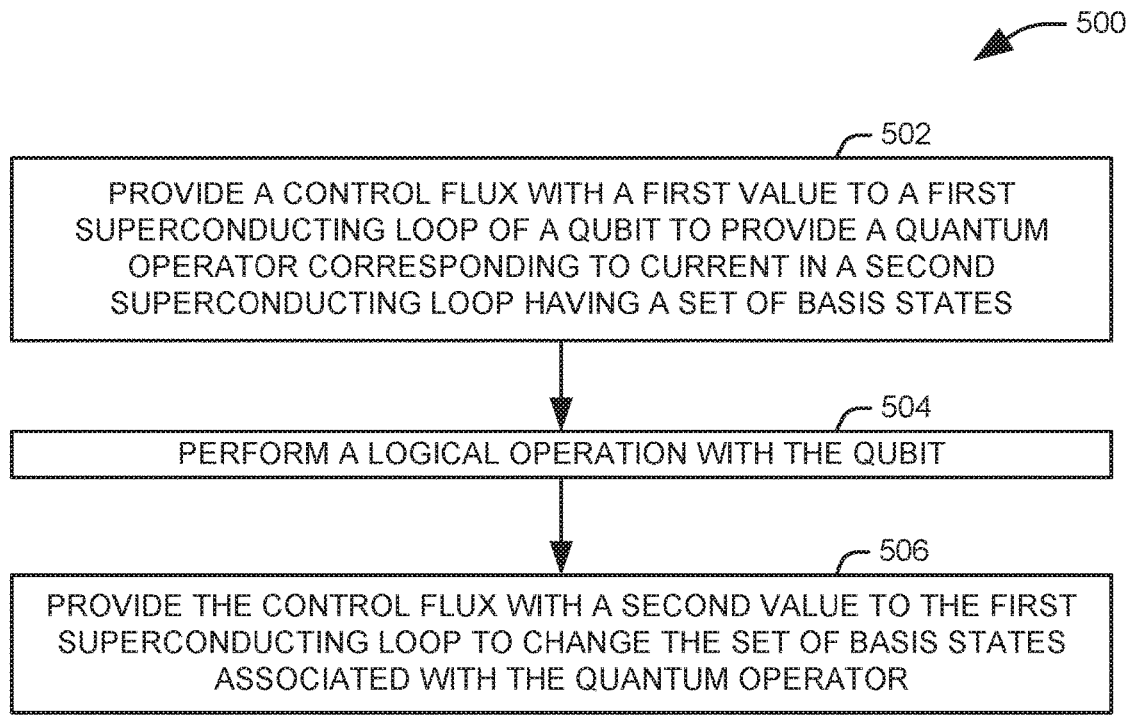
FIG. 5 represents a method for performing a rotation of a qubit in accordance with an aspect of the present invention.
Figure 4:
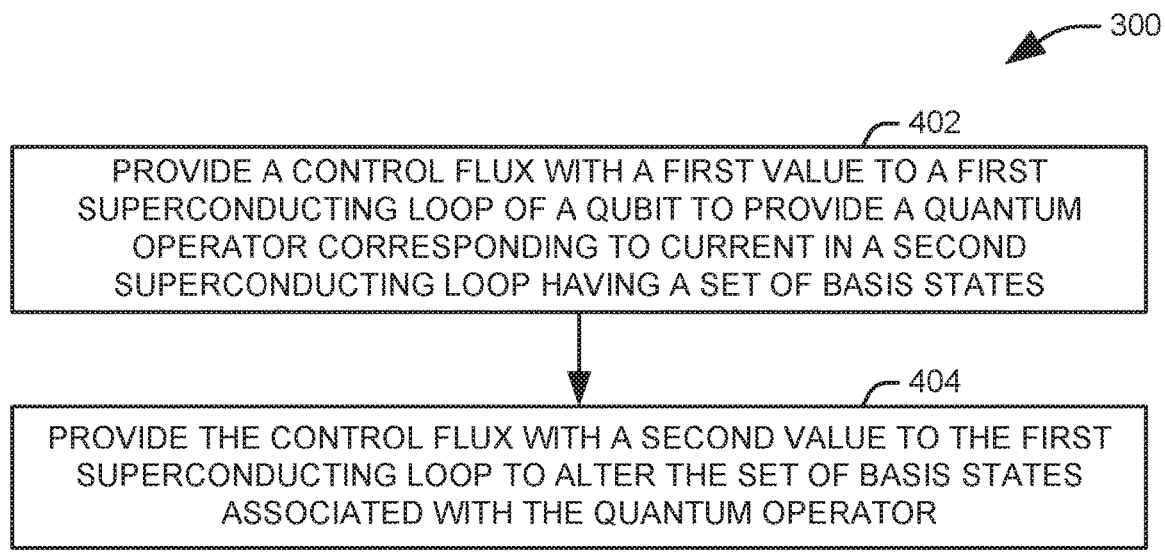
FIG. 4 illustrates a method for providing a current operator in a qubit.
Figure 6:
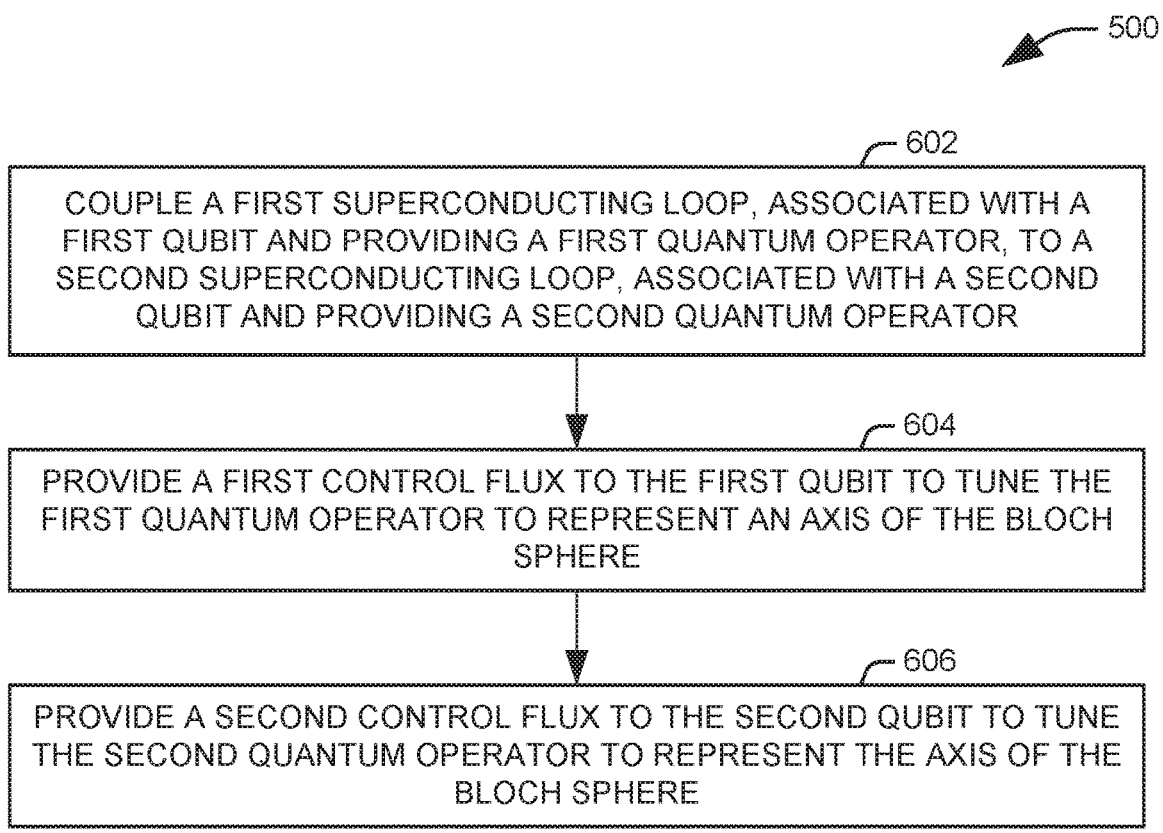
FIG. 6 illustrates a method for coupling two qubits along a specific axis of the Bloch sphere.

In view of the foregoing structural and functional features described above in FIGS. 1-3, example methods will be better appreciated with reference to FIGS. 4-6. While, for purposes of simplicity of explanation, the methods of FIGS. 4-6 are shown and described as executing serially, it is to be understood and appreciated that the present invention is not limited by the illustrated order, as some actions could in other examples occur in different orders and/or concurrently from that shown and described herein.

FIG. 4 illustrates a method 400 for providing a current operator in a qubit. At 402, a control flux, having a first value, is provided to a first superconducting loop of a qubit to provide a quantum operator corresponding to current in a second superconducting loop having a set of basis states. At 404, a second value for the control flux to the first superconducting loop of a qubit to alter the set of basis states associated with the quantum operator. In one example, a primary operator associated with the qubit, for example, a voltage operator, is designated as the Pauli-Z operator, and one current operator, associated with a third superconducting loop, is designated as the Pauli-X operator. The quantum operator can be tuned, via the control flux, to provide an operator proportional to COS $$\left(\frac{2\pi\phi}{\phi_0}\right)\sigma_x + \sin\left(\frac{2\pi\phi}{\phi_0}\right)\sigma_y,$$

where $\phi$ is a value of the control flux. It will be appreciated that the qubit can be measured along each of the primary operator, the current operator, or the tunable quantum operator.

FIG. 5 represents a method 500 for performing a rotation of a qubit in accordance with an aspect of the present invention. At 502, a control flux, having a first value, is provided to a first superconducting loop of a qubit to provide a quantum operator corresponding to current in a second superconducting loop having a set of basis states. At 504, a logical operation is performed with the qubit. For example, the qubit can be used as part of a logical gate operation, such as a target or control qubit in a controlled rotation gate. In one implementation, each of a set of basis states associated with the quantum operator and the logical operator can be recorded at a classical computer. The basis states can be represented, for example, as an axis of the Bloch sphere representing the operator. At 506, a second value for the control flux is provided to the first superconducting loop of a qubit, such that the set of basis states associated with the quantum operator is changed. It will be appreciated that the recorded basis states can be used to interpret a later measurement result to represent a passive rotation of the qubit.

FIG. 6 illustrates a method 600 for coupling two qubits along a specific axis of the Bloch sphere. At 602, a first superconducting loop, associated with a first qubit and providing an associated first quantum operator, is coupled to a second superconducting loop, associated with a second qubit and providing an associated second quantum operator. At 604, a first control flux is provided to the first qubit to tune the first quantum operator to represent an axis of the Bloch sphere. For example, the first superconducting loop can share a Josephson junction with a third superconducting loop, and the first control flux can be provided to the third superconducting loop. At 606, a second control flux is provided to the second qubit to tune the second quantum operator to represent the axis of the Bloch sphere. For example, the second superconducting loop can share a Josephson junction with a fourth superconducting loop, and the second control flux can be provided to the fourth superconducting loop.

As mentioned previously, the method 600 may not proceed in the order illustrated. For example, the coupling between the first superconducting loop and the second superconducting loop at 602 may be performed via a tunable coupler assembly positioned between the first superconducting loop and the second superconducting loop such that providing a third control flux to the tunable coupler assembly allows for selective coupling of the loops. In such a case, the two qubits may not be coupled at 602 until the first and second quantum operators have been tuned at 604 and 606.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A qubit assembly comprising:
a first superconducting loop comprising a first Josephson junction and a second Josephson junction;
a second superconducting loop comprising the second Josephson junction and a third Josephson junction;
a third superconducting loop comprising the third Josephson junction and a fourth Josephson junction; and
a flux source configured to provide a magnetic control flux to the second superconducting loop, such that the effective commutation relations between a first quantum operator corresponding to current in the first superconducting loop and a second quantum operator corresponding to current in the third superconducting loop can be changed by changing a magnitude of the magnetic control flux provided to the second superconducting loop by the flux source.

2. The qubit assembly of claim 1, wherein the first quantum operator represents a selected X-axis for the qubit assembly and the second quantum operator can be configured to represent an arbitrary axis within a plane of the Bloch sphere by changing a magnitude of the magnetic control flux provided to the second superconducting loop.

3. The qubit assembly of claim 2, wherein a quantum operator corresponding to voltage on the superconducting island adjoining the loops represents a third axis within the Bloch sphere perpendicular to each of the X-axis and the arbitrary axis.

4. The qubit assembly of claim 1, wherein the magnetic control flux is a first magnetic control flux, and the qubit assembly further comprises fourth and fifth superconducting loops, with the fourth loop comprising the first Josephson junction and a fifth Josephson junction and the fifth loop comprising the fifth Josephson junction and a sixth Josephson junction, the flux source being configured to provide a second magnetic control flux to the fourth superconducting loop, such that the effective commutation relations between the first quantum operator and a third quantum operator corresponding to current in the fifth superconducting loop can be changed by changing a magnitude of the second magnetic control flux.

5. The qubit assembly of claim 1, wherein the first superconducting loop comprises a first path to ground, interrupted by the first Josephson junction, and a second path to ground, interrupted by the second Josephson junction, the second superconducting loop comprises the second path to ground and a third path to ground, interrupted by the third Josephson junction, and the third superconducting loop comprises the third path to ground and a fourth path to ground, interrupted by the fourth Josephson junction.

6. The qubit assembly of claim 1, wherein at least one of the first Josephson junction, the second Josephson junction, the third Josephson junction, and the fourth Josephson junction is a compound Josephson junction.

7. The qubit assembly of claim 1, further comprising a readout resonator coupled to the third superconducting loop and configured to measure a state of the second quantum operator.

8. A quantum system comprising:
the qubit assembly of claim 1, wherein the flux source is a first flux source and the magnetic control flux is a first magnetic control flux; and
a second qubit assembly comprising:
a fourth superconducting loop comprising a fifth Josephson junction and a sixth Josephson junction;
a fifth superconducting loop comprising the sixth Josephson junction and a seventh Josephson junction;
a sixth superconducting loop comprising the seventh Josephson junction and a eighth Josephson junction; and
a second flux source configured to provide a second magnetic control flux to the fifth superconducting loop, such that the effective commutation relations between a third quantum operator corresponding to current in one of the fourth superconducting loop and a fourth quantum operator corresponding to current in the sixth superconducting loop can be changed by changing a magnitude of the second magnetic control flux; and
a coupling assembly configured to couple the third superconducting loop to the sixth superconducting loop.

9. The quantum system of claim 8, wherein the coupling assembly is a tunable coupler comprising a compound Josephson junction.

10. A method comprising:
coupling a first superconducting loop, associated with a first qubit and having an associated first quantum operator, to a second superconducting loop, associated with a second qubit and having an associated second quantum operator;
providing a first control flux to the first qubit to tune the first quantum operator to represent an axis of the Bloch sphere; and
providing a second control flux to the second qubit to tune the second quantum operator to represent the axis of the Bloch sphere, such that the first qubit and the second qubit are coupled along the axis of the Bloch sphere associated with the first and second quantum operators.

11. The method of claim 10, wherein providing the first control flux to the first qubit comprises providing the first control flux to a third superconducting loop that shares at least one Josephson junction with the first superconducting loop.

12. The method of claim 11, wherein a the axis of the Bloch sphere represented by the first current operator varies with a value, $\phi$, for the first control flux in a manner proportional to COS $$\left(\frac{2\pi\phi}{\phi_0}\right)\sigma_x + \sin\left(\frac{2\pi\phi}{\phi_0}\right)\sigma_y.$$

13. The method of claim 10, coupling the first superconducting loop to the second superconducting loop comprises providing a third control flux to a tunable coupler assembly positioned between the first superconducting loop and the second superconducting loop.

14. A system comprising:
a first qubit assembly comprising:
a first superconducting loop comprising a first Josephson junction and a second Josephson junction;
a second superconducting loop comprising the second Josephson junction and a third Josephson junction;
a third superconducting loop comprising the third Josephson junction and a fourth Josephson junction;
a first flux source configured to provide a first magnetic control flux to the second superconducting loop, such that the effective commutation relations between a first quantum operator corresponding to current in the first superconducting loop and a second quantum operator corresponding to current in the third superconducting loop can be changed by changing a magnitude of the first magnetic control flux provided to the second superconducting loop by the first flux source;

a second qubit assembly comprising:
  a fourth superconducting loop comprising a fifth Josephson junction and a sixth Josephson junction;
  a fifth superconducting loop comprising the sixth Josephson junction and a seventh Josephson junction;
  a sixth superconducting loop comprising the seventh Josephson junction and a eighth Josephson junction; and
  a second flux source configured to provide a second magnetic control flux to the fifth superconducting loop, such that the effective commutation relations between a third quantum operator corresponding to current in one of the fourth superconducting loop and a fourth quantum operator corresponding to current in the sixth superconducting loop can be changed by changing a magnitude of the second magnetic control flux; and
  a coupling assembly configured to couple the third superconducting loop to the sixth superconducting loop.

15. The system of claim 14, wherein the coupling assembly is a first coupling assembly, the system further comprising a third qubit assembly coupled to the first qubit assembly via a second coupling assembly such that an alignment of respective voltage operators associated with the first qubit assembly and the third qubit assembly is energetically favorable.

16. The system of claim 14, wherein the coupling assembly is a first coupling assembly, the system further comprising:
  a third qubit assembly comprising:
    a seventh superconducting loop comprising a ninth Josephson junction and a tenth Josephson junction;
    a eighth superconducting loop comprising the tenth Josephson junction and a eleventh Josephson junction;
    a ninth superconducting loop comprising the eleventh Josephson junction and a twelfth Josephson junction; and
    a third flux source configured to provide a third magnetic control flux to the eighth superconducting loop, such that the effective commutation relations between a fifth quantum operator corresponding to current in one of the seventh superconducting loop and a sixth quantum operator corresponding to current in the ninth superconducting loop can be changed by changing a magnitude of the third magnetic control flux; and
  a second coupling assembly configured to couple the first superconducting loop to the seventh superconducting loop.

17. The system of claim 16, the system further comprising a fourth qubit assembly coupled to the first qubit assembly via a third coupling assembly such that an alignment of respective voltage operators associated with the first qubit assembly and the fourth qubit assembly is energetically favorable.

18. The system of claim 14, wherein the coupling assembly is a tunable coupler comprising a compound Josephson junction.

* * * * *